(12) United States Patent
Kato et al.

(10) Patent No.: US 6,222,427 B1
(45) Date of Patent: *Apr. 24, 2001

(54) INDUCTOR BUILT-IN ELECTRONIC PARTS USING VIA HOLES

(75) Inventors: Noboru Kato, Sabae; Atsushi Tojyo, Fukui, both of (JP)

(73) Assignee: Murata Manufacturing Co., Ltd., Nagaokakyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/684,196

(22) Filed: Jul. 19, 1996

(30) Foreign Application Priority Data

Jul. 19, 1995 (JP) ..................................... 7-206482

(51) Int. Cl.⁷ ................. H03H 7/01; H03H 7/09
(52) U.S. Cl. ................ 333/185; 333/184; 333/177
(58) Field of Search ...................... 333/184, 185, 333/187; 336/200, 232

(56) References Cited

U.S. PATENT DOCUMENTS 5,029,043 * 7/1991 Kitahara et al. ............. 333/185 X
5,055,816  10/1991 Altman et al. ................ 336/200
5,404,118   4/1995 Okamura et al. ............. 333/175

FOREIGN PATENT DOCUMENTS

| 0 134 556 | 3/1985 | (EP) . | |
|---|---|---|---|
| 0 134 556 A1 | 3/1985 | (EP) . | |
| 0 311 418 A2 | 4/1989 | (EP) . | |
| 0 512 718 A1 | 11/1992 | (EP) . | |
| 3-166809 * | 7/1991 | (JP) | 333/185 |
| 4-6911 * | 1/1992 | (JP) | 333/185 |
| 4-165606 | 6/1992 | (JP) . | |
| 5-13237 * | 1/1993 | (JP) | 336/200 |
| 5267972 * | 10/1993 | (JP) | 333/184 |
| 6013240 * | 1/1994 | (JP) | 336/200 |
| 07-037758 | 2/1995 | (JP) . | |
| 7-66078 | 3/1995 | (JP) . | |
| WO 94/22281 | 9/1994 | (WO) . | |

* cited by examiner

Primary Examiner—Justin P. Bettendorf
(74) Attorney, Agent, or Firm—Burns, Doane, Swecker & Mathis, LLP

(57) ABSTRACT

A small inductor built-in electronic part whose Q is high is provided. An LC resonator comprises a laminate composed of a number of laminated electronic layers. Capacitor electrodes, common electrodes, and ground electrodes are formed between the dielectric layers. Two via holes are formed penetrating through the plurality of intermediate dielectric layers in the thickness direction thereof leaving a space therebetween. These via holes act as inductor elements.

14 Claims, 6 Drawing Sheets

INDUCTOR BUILT-IN ELECTRONIC PARTS USING VIA HOLES

BACKGROUND OF THE INVENTION

1. Field of the Invention

The present invention relates to electronic parts with an integrally built-in inductor and, more particularly, to electronic parts such as an inductor, an LC resonator, band-pass filter and an LC filter for use in a portable radio equipment, for example.

2. Description of Related Art

FIG. 7 is an equivalent circuit diagram showing one example of an LC filter acting as a band-pass filter to which the present invention can be applied. The LC filter includes two LC resonators R1 and R2. One LC resonator R1 comprises a first inductor L1 and a first capacitor C1 connected in parallel, and the other LC resonator R2 comprises a second inductor L2 and a second capacitor C2 connected in parallel. It is noted that the first and second inductors L1 and L2 are electromagnetically coupled to each other. One end of the first LC resonator R1 is connected to a first input/output terminal T1 via a third capacitor C3 and one end of the second LC resonator R2 is connected to a second input/output terminal T2 via a fourth capacitor C4. Other ends of the first and second LC resonators R1 and R2 are connected to ground terminals G, respectively.

FIG. 8 is an exploded perspective view showing a main part of the exemplary prior art LC filter having the equivalent circuit shown in FIG. 7. The prior art LC filter 1 shown in FIG. 8 includes four dielectric layers 2a, 2b, 2c and 2d to be laminated together. A first capacitor electrode 3a and the like is formed on the upper surface of the first dielectric layer 2a, a second capacitor electrode 3b and the like is formed on the upper surface of the second dielectric layer 2b and a spiral pattern electrode 4 which acts as an inductor element is formed on the upper surface of the third dielectric layer 2c, the first, second and third electrodes 3a, 3b and 3c being formed of printing conductors by means of thick film printing. The first capacitor C1 of the first LC resonator R1 is formed between the first and second capacitor electrodes 3a and 3b and the first inductor L1 of the first LC resonator R1 is formed by the spiral pattern electrode 4. Similarly, the second capacitor C2 of the other LC resonator R2 is formed between other two capacitor electrodes (not shown) on either side of the second dielectric layer 2b, and the second inductor L2 of the second LC resonator R2 is formed by another pattern electrode (not shown) formed on the upper surface of the third dielectric layer 2c. It is noted that external electrodes (not shown) which act as the input/output terminals T1 and T2 and the ground terminals G are formed on side faces of the dielectric layers 2a through 2d. Further, the third and fourth capacitors C3 and C4 are formed by other capacitor electrodes (not shown) between one end of each of the LC resonators R1 and R2 and the external electrodes which act as the input/output terminals T1 and T2, respectively. The other ends of the LC resonators R1 and R2 are connected to the external electrodes which act as the ground terminals G.

Because each capacitor, which is relatively close to an ideal capacitor, is created in the prior art LC filter 1 shown in FIG. 8, the Q (quality factor) of the whole is influenced largely by the Q of the built-in inductor. Therefore, in order to improve the Q of the LC filter 1, it is conceivable to improve the Q of the inductor by increasing a sectional area of the pattern electrode which acts as the inductor element. It is then conceivable to thicken a width of the pattern electrode in order to increase the sectional area of the pattern electrode, because a thickness of the pattern electrode formed by means of thick film printing is only about 10-odd mm. However, the prior art LC filter has had a problem in that when the width of the pattern electrode is thickened, a value of inductance generated by the pattern electrode made within an equal area becomes small and a large floating capacity is generated between the electrodes similar to the capacitor electrodes which vertically face each other. The result is a drop in Q, contrary to the purpose of the design modification. It is noted that this kind of problem also exists in other built-in inductor electronic parts such as prior art inductors and LC resonators in which a pattern electrode acts as an inductor element and is formed by means of thick film printing.

The prior art LC filter 1 shown in FIG. 8 also has had a problem that although the Q of the whole is improved when the space between the pattern electrode and the vertically disposed capacitor electrode is widened, a thickness of the whole, i.e. the size thereof, is increased and it cannot be mounted within small equipment such as portable radio equipment whose thickness is limited. It is noted that this kind of problem also exists in the other inductor built in electronic parts such as prior art LC resonators in which the pattern electrode which acts as an inductor element and the capacitor electrode are formed, respectively, by means of thick film printing.

Further, the LC filter 1 shown in FIG. 8 has had a problem in that because a line of magnetic force generated by the pattern electrode crosses with the main surface of the capacitor electrode at almost right angles as shown in FIG. 9, a significant eddy current loss is generated on the capacitor electrode by the line of magnetic force, thus dropping the Q of the whole. It is noted that this kind of problem also exists in the other built-in inductor electronic parts such as the prior art LC resonator in which the pattern electrode which acts as an inductor element and the capacitor electrode are formed, respectively, by means of thick film printing.

Accordingly, it is a primary object of the present invention to provide a small built-in inductor electronic parts whose Q is high.

SUMMARY OF THE INVENTION

In order to achieve the aforementioned goal, a built-in inductor electronic part of the present invention is constructed so that an inductor is formed by a via hole penetrating through a plurality of laminated ceramic layers in the thickness direction thereof.

It is noted that the inventive built-in inductor electronic parts may be constructed so that an inductor is formed by a plurality of via holes penetrating through a plurality of laminated ceramic layers in the thickness direction thereof.

Further, the inventive built-in inductor electronic parts may be constructed so that capacitor electrodes are formed between the plurality of ceramic layers.

Because the inductors are formed by the via holes penetrating through the plurality of laminated ceramic layers in the thickness direction thereof, a sectional area of the inductor increases, thereby improving the Q of the built-in inductor electronic parts. A size of the built-in inductor electronic parts may be kept small because an area of the main surface and thickness of the ceramic layer need not be increased.

Accordingly, the present invention allows the small built-in inductor electronic parts whose Q is high to be obtained.

It is noted that a value of inductance may be readily controlled in the inventive inductor because a length of the conductor as the inductor is elongated by forming the inductor by the plurality of via holes penetrating through the plurality of laminated ceramic layers in the thickness direction and the value of inductance will not change so much even if the length of the conductor is changed by small amounts, e.g., the variation of thickness among the ceramic layers.

Further, because the main surface of the capacitor electrode is parallel with lines of magnetic force generated by the inductor created by the via hole when forming the capacitor electrodes between the plurality of ceramic layers, less eddy current loss is generated by the lines of magnetic force on the capacitor electrode and the Q will hardly drop.

The above and other related objects, features and advantages of the present invention will be apparent from a reading of the following description of preferred embodiments of the present invention explained with reference to the accompanying drawings in which like numerals refer to like parts.

DESCRIPTION OF PREFERRED EMBODIMENTS

Preferred embodiments of the present invention will be explained below with reference to the drawings.

Figure 1:
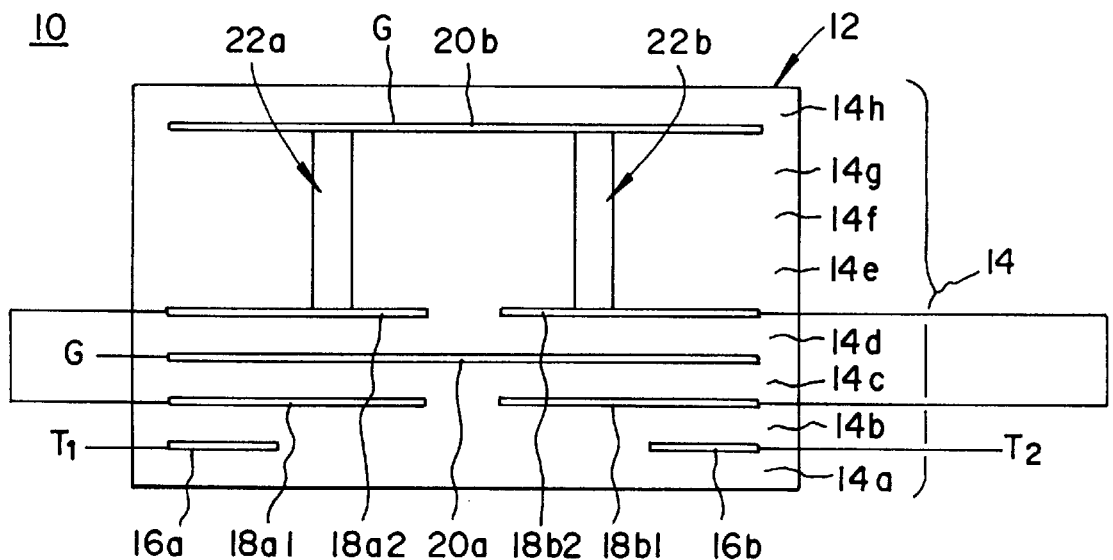
FIG. 1 is a diagrammatic view showing a first embodiment of the present invention.

FIG. 1 is a diagrammatic view showing one preferred embodiment of the present invention. An LC filter 10 shown in FIG. 1 includes rectangular parallelepiped multi-layered substrates or laminate 12. The laminate 12 is formed by laminating a number of dielectric layers 14a, 14b, 14c, ... made out of a number of ceramic layers.

First and second capacitor electrodes 16a and 16b are formed between the bottom two dielectric layers 14a and 14b leaving a space therebetween.

First and second common electrodes 18a1 and 18b1 are formed between the second and third dielectric layers 14b and 14c from the bottom leaving a space therebetween within their common plane. The first and second common electrodes 18a1 and 18b1 face the first and second capacitor electrodes 16a and 16b, respectively, via the second dielectric layer 14b.

A first ground electrode 20a is formed between the third and fourth dielectric layers 14c and 14d from the bottom. This first ground electrode 20a faces to the first and second common electrodes 18a1 and 18b1 via the third dielectric layer 14c.

Third and fourth common electrodes 18a2 and 18b2 are formed between the fourth and fifth dielectric layers 14d and 14e from the bottom leaving a space therebetween. The third and fourth common electrodes 18a2 and 18b2 face the first ground electrode 20a via the fourth dielectric layer 14d.

A second ground electrode 20b is formed between the uppermost dielectric layers 14g and 14h.

First and second columnar via holes 22a and 22b (which are filled with conductive material) are created in the plurality of dielectric layers 14e, 14f, 14g penetrating therethrough in the thickness direction between a plane common to the third and fourth common electrodes 18a2–18b2 and the second ground electrode 20b. These first and second via holes 22a and 22b act as inductor elements. It is noted that the first and second via holes 22a and 22b are electromagnetically coupled to each other.

It is also noted that although not shown, a part of each of the first and second capacitor electrodes 16a and 16b, the first through fourth common electrodes 18a1, 18b1, 18a2 and 18b2 and the first and second ground electrodes 20a and 20b extends to the end of the dielectric layers 14 and each end face thereof is exposed out of the side face of the laminate 12.

The plurality of external electrodes are formed on the side face of the laminate 12. Two external electrodes among the plurality of external electrodes are connected respectively with the first and second capacitor electrodes 16a and 16b and are used as input/output terminals T1 and T2. Other external electrodes are connected with the first and third common electrodes 18a1 and 18a2 as well as the second and fourth common electrodes 18b1 and 18b2 to be used as connecting terminals. Further, other external electrodes are connected with the first and second ground electrodes 20a and 20b to be used as ground terminals G.

A first capacitor C1 of a first LC resonator R1 is formed between the first and third common electrodes 18a1 and 18a2 and the first ground electrode 20a. A first inductor L1 of the first LC resonator R1 is formed by the first via hole 22a. Further, a second capacitor C2 of a second LC resonator R2 is formed between the second and fourth common electrodes 18b1 and 18b2 and the first ground electrode 20a and a second inductor L2 of the second LC resonator R2 is formed by the second via hole 22b. It is noted that because the first and second via holes 22a and 22b are electromagnetically coupled to each other, the inductors L1 and L2 are also electromagnetically coupled to each other. Further, a third capacitor C3 is formed between the first capacitor electrode 16a and the first common electrode 18a1 and a fourth capacitor C4 is formed between the second capacitor electrode 16b and the second common electrode 18b1.

Figure 7:
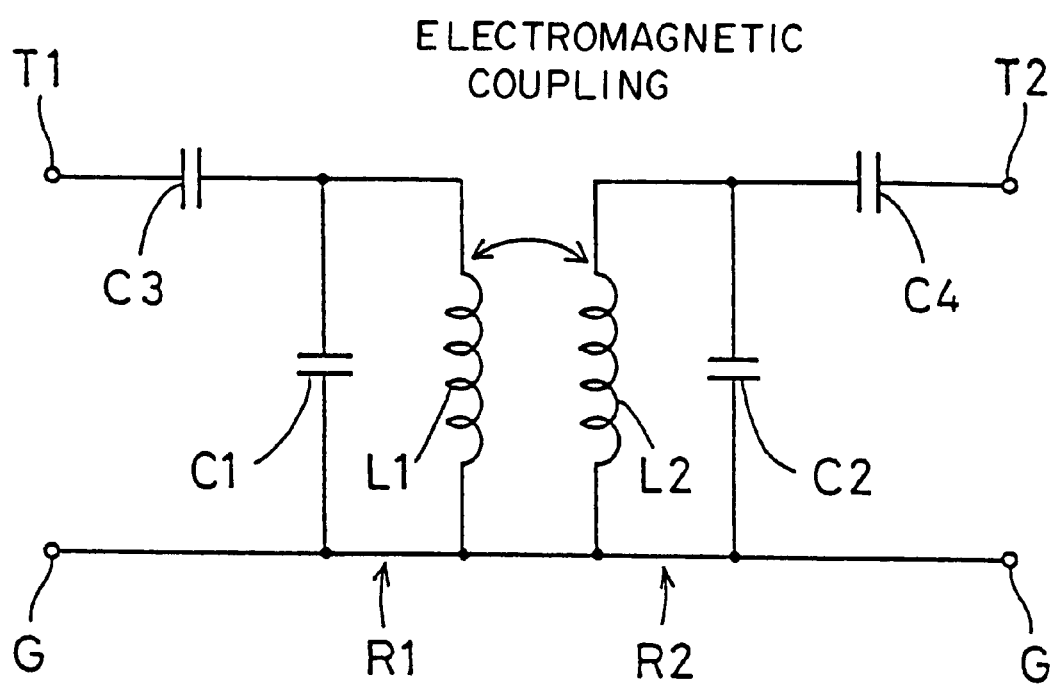
FIG. 7 is an equivalent circuit diagram showing one example of an LC filter which is background information for the present invention and to which the present invention is applied.

Accordingly, the LC filter 10 shown in FIG. 1 has the equivalent circuit shown in FIG. 7.

Figure 8:
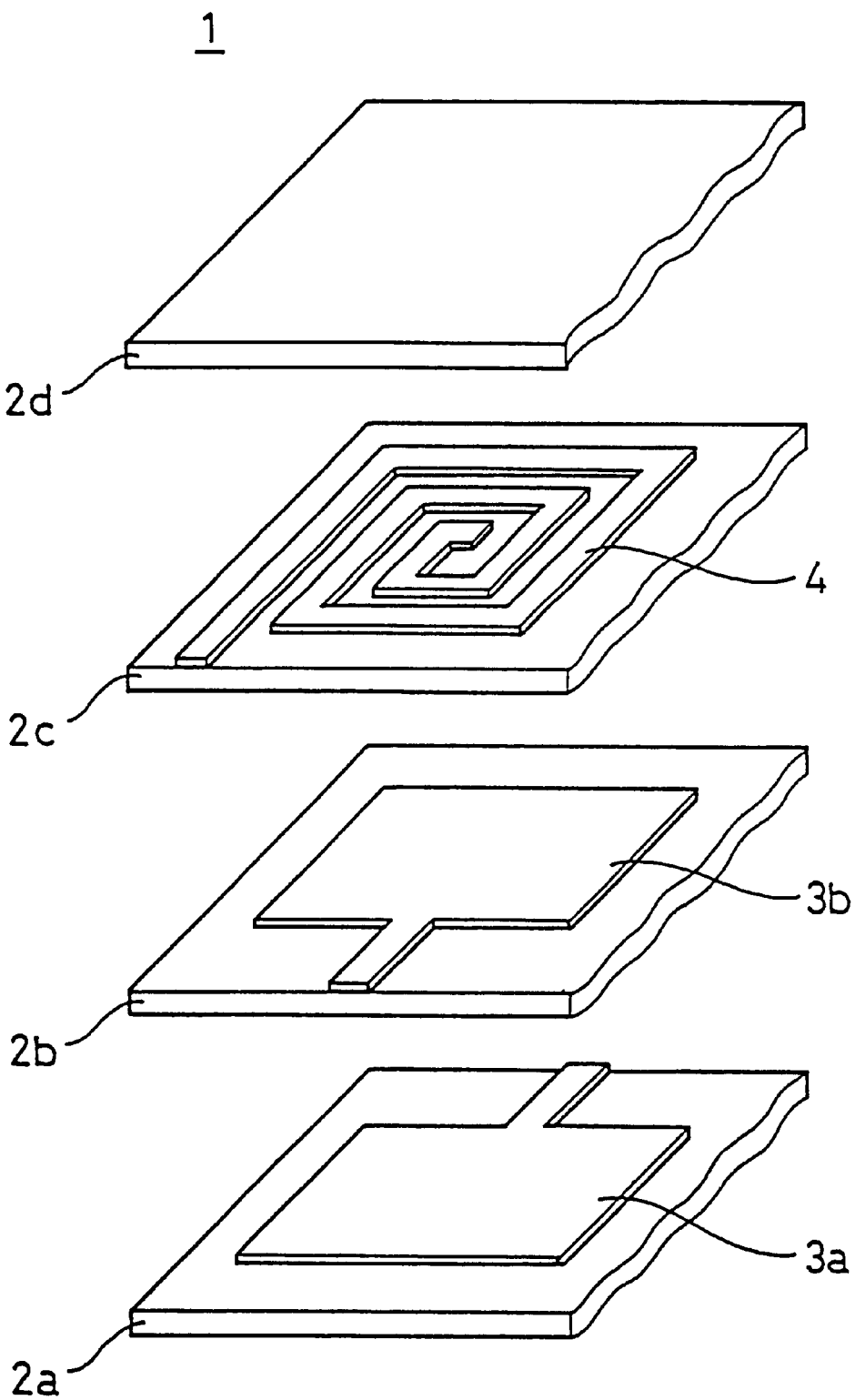
FIG. 8 is an exploded perspective view showing a main part of one example of the prior art LC filter having the equivalent circuit shown in FIG. 7.
Figure 9:
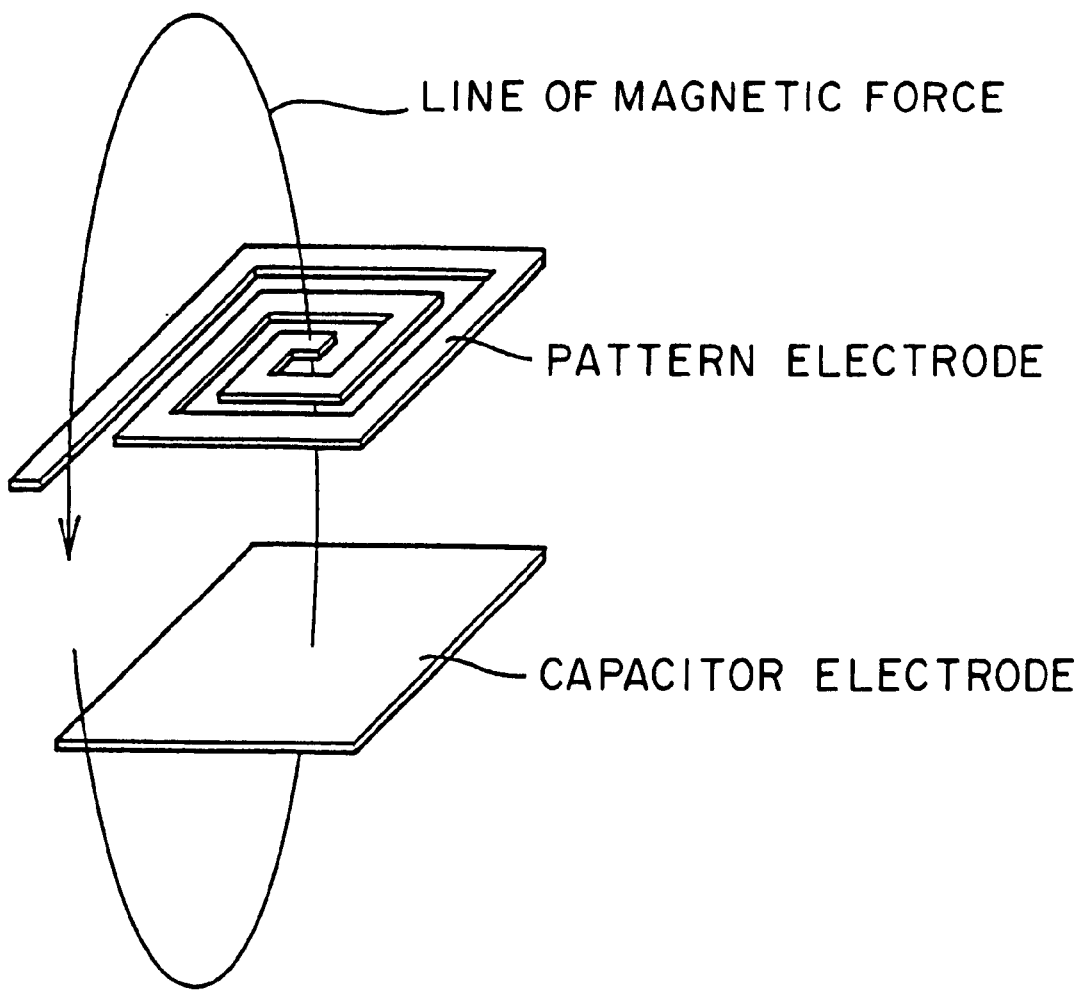
FIG. 9 is a diagrammatic view showing a relationship between a line magnetic force generated by a pattern electrode and a capacitor electrode in the LC filter shown in FIG. 8.

In the LC filter 10 shown in FIG. 1, a sectional area of the inductor increases as compared to that of the prior art example shown in FIG. 8 because the first and second via holes 22a and 22b which penetrate through the plurality of laminated dielectric layers 14e, 14f, 14g in the thickness direction act as the inductor. Thereby, the Q of the LC filter 10 increases more than twice, for example, as compared to the prior art example shown in FIG. 8. In contrast to the prior art example, the area of the main surface and the thickness of the dielectric layers, i.e. the ceramic layers, need not be increased in this LC filter 10, so that its size can be kept small.

Figure 2:
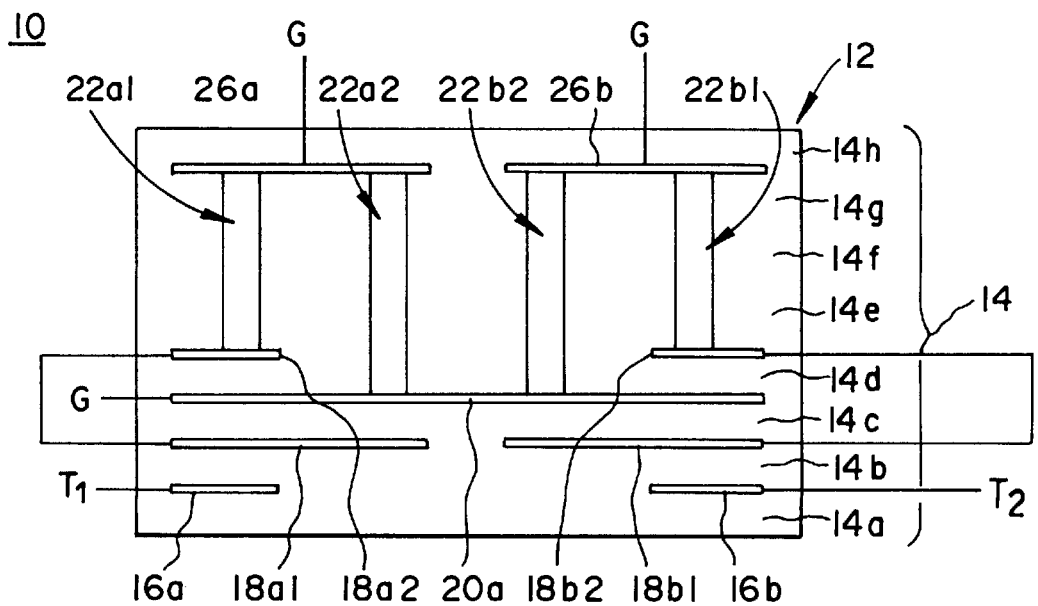
FIG. 2 is a diagrammatic view showing a second embodiment of the present invention.
Figure 3:
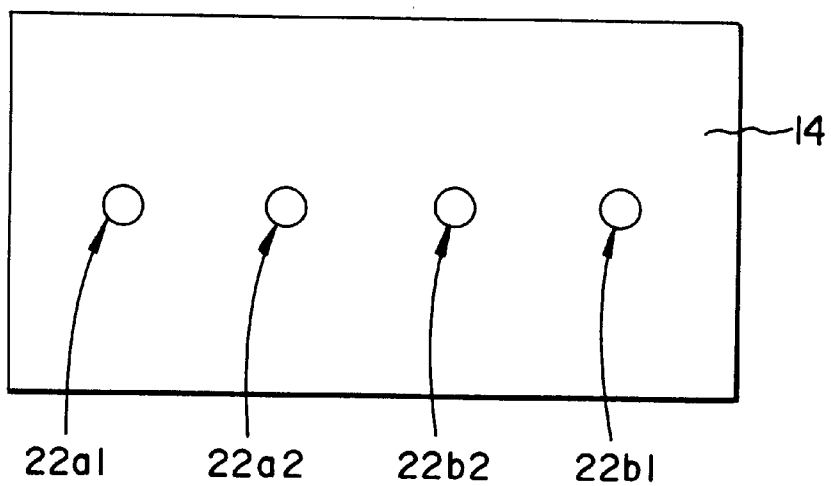
FIG. 3 is a diagrammatic view showing a main part of the second embodiment shown in FIG. 2.

FIG. 2 is a diagrammatic view showing a second embodiment of the present invention and FIG. 3 is a diagrammatic view showing a main part thereof. As compared to the embodiment of the present invention shown in FIG. 1, the embodiment of the present invention shown in FIGS. 2 and 3 is characterized in that each inductor element is formed by two via holes.

That is, as compared to the embodiment shown in FIG. 1, third and fourth small common electrodes 18a2 and 18b2 are formed between the fourth and the fifth dielectric layers 14d and 14e and first and second connecting electrodes 26a and 26b are formed between the uppermost dielectric layers 14g and 14h leaving a space therebetween in the embodiment shown in FIGS. 2 and 3. It is noted that a part of each of these connecting electrodes 26a and 26b needs not be extended to the end of the dielectric layers 14 and each end needs not be exposed out of the side face of the laminate 12. First and second columnar via holes 22a1 and 22b1 which penetrate through the plurality of dielectric layers 14e, 14f, 14g in the thickness direction are created between the third common electrode 18a2 and the first connecting electrode 26a and between the fourth common electrode 18b2 and the second connecting electrode 26b, respectively. Further, third and fourth columnar via holes 22a2 and 22b2 which penetrate through the plurality of dielectric layers 14d, 14e, 14f and 14g in the thickness direction are created between the first ground electrode 20a and the first and second connecting electrodes 26a and 26b. These four via holes 22a1, 22b1, 22a2 and 22b2 act as inductor elements. It is noted that the third and fourth via holes 22a2 and 22b2 are electromagnetically coupled to each other.

While a number of external electrodes which are used as the input/output terminals T1 and T2, connecting terminals and ground terminals G are formed on the side face of the laminate 12 in the embodiment shown in FIGS. 2 and 3 similar to the embodiment shown in FIG. 1, the external electrode used as the ground terminal G is connected only to the first ground electrode 20a.

Further, while each capacitor C1, C2, C3 and C4 are formed in the embodiment shown in FIGS. 2 and 3 similar to the embodiment shown in FIG. 1, the first inductor L1 of the first LC resonator R1 is formed by the via first and third holes 22a1 and 22a2 connected by the first connecting electrode 26a and the second inductor L2 of the second LC resonator R2 is formed by the second and fourth via holes 22b1 and 22b2 connected by the second connecting electrode 26b.

Accordingly, the LC filter 10 shown in FIGS. 2 and 3 also has the equivalent circuit shown in FIG. 7.

A sectional area of the inductor increases as compared to the prior art example shown in FIG. 8 also in the embodiment shown in FIGS. 2 and 3 similar to the embodiment shown in FIG. 1, so that the Q improves and the whole size can be kept small.

Further, because one inductor element is created by the two via holes penetrating through the plurality of laminated dielectric layers in the thickness direction in the embodiment shown in FIGS. 2 and 3, a length of the conductor as one inductor element is elongated. Thereby, a value of inductance may be readily controlled because the value of inductance will not change significantly even if the length of the conductor is changed more or less by the variation in thicknesses of the dielectric layers.

Figure 4:
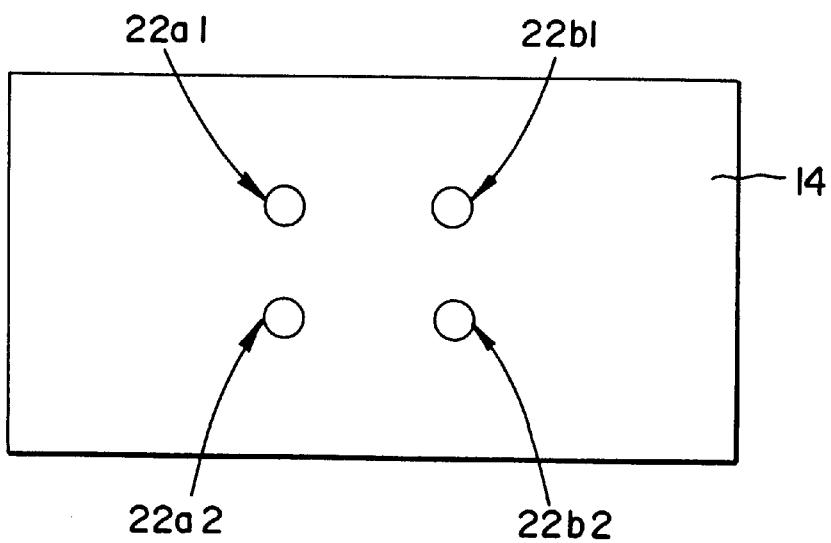
FIG. 4 is a diagrammatic view showing a main part of a variation of the second embodiment shown in FIGS. 2 and 3.

FIG. 4 is a diagrammatic view showing a main part of a variation of the second embodiment shown in FIGS. 2 and 3. As compared to the embodiment shown in FIGS. 2 and 3, the embodiment shown in FIG. 4 is characterized in that four via holes 22a1, 22b1, 22a2 and 22b2 are closely positioned in a matrix of two lines and two columns as viewed from above. Further, the third and fourth common electrodes 18a2 and 18b2 (see,e.g. FIG. 1) to which one ends of the first and second via holes 22a1 and 22b1 are connected, respectively, are formed at positions corresponding to the first and second via holes 22a1 and 22b1. Accordingly, the strength of the electromagnetic coupling of the inductors L1 and L2 increases in the embodiment shown in FIG. 4 as compared to the embodiment shown in FIGS. 2 and 3.

Figure 5:
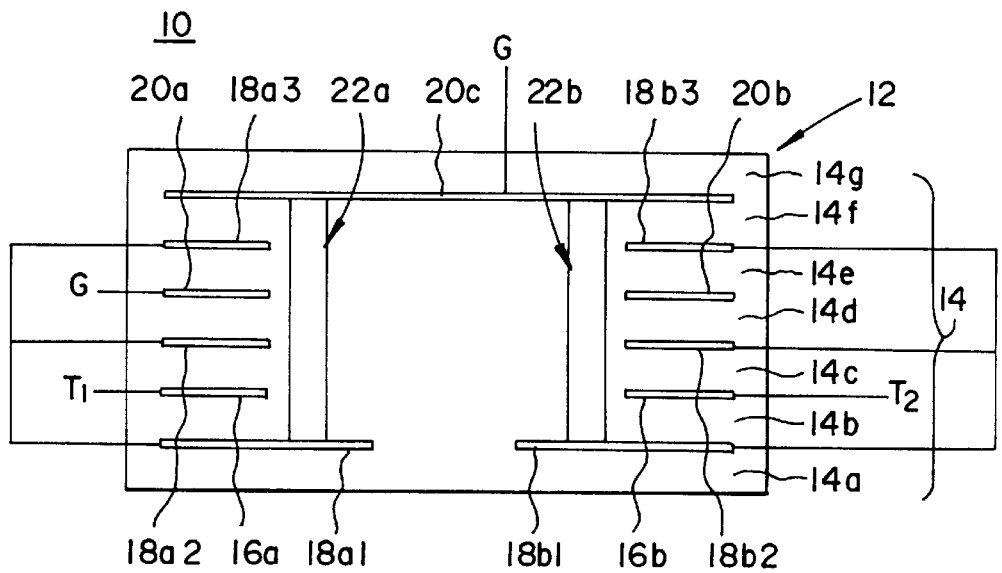
FIG. 5 is a diagrammatic view showing a third embodiment of the present invention.

FIG. 5 is a diagrammatic view showing a third embodiment of the present invention. An LC filter 10 shown in FIG. 5 also includes rectangular parallelepiped multi-layered substrates or laminate 12 formed by laminating a number of dielectric layers 14a, 14b, 14c, . . . or the like made out of a number of ceramic layers.

First and second common electrodes 18a1 and 18b1 are formed between the bottom dielectric layers 14a and 14b leaving a space therebetween.

First and second capacitor electrodes 16a and 16b are formed between the second and third dielectric layers 14b and 14c from the bottom leaving a space therebetween. These first and second capacitor electrodes 16a and 16b face to the first and second common electrodes 18a1 and 18b1, respectively, via the second dielectric layer 14b.

Third and fourth common electrodes 18a2 and 18b2 are formed between the third and fourth dielectric layers 14c and 14d from the bottom leaving a space therebetween. The third and fourth common electrodes 18a2 and 18b2 face to the first and second capacitor electrodes 16a and 16b, respectively, via the third dielectric layer 14c.

First and second ground electrodes 20a and 20b are formed between the fourth and fifth dielectric layers 14d and 14e from the bottom leaving a space therebetween. These ground electrodes 20a and 20b face the third and fourth common electrodes 18a2 and 18b2, respectively, via the fourth dielectric layer 14d.

Fifth and sixth common electrodes 18a3 and 18b3 are formed between the fifth and sixth dielectric layers 14e and 14f from the bottom leaving a space therebetween. These common electrodes 18a3 and 18b3 face the first and second ground electrodes 20a and 20b, respectively, via the fifth dielectric layer 14e.

A third ground electrode 20c is formed between the uppermost dielectric layers 14f and 14g. The third ground electrode 20c faces the fifth and sixth common electrodes 18a3 and 18b3 via the sixth dielectric layer 14f.

First and second columnar via holes 22a and 22b are formed in the plurality of dielectric layers 14b, 14c, 14d, 14e and 14f penetrating therethrough in the thickness direction between the first and second common electrodes 18a1 and 18b1 and the third ground electrode 20c. These via holes 22a and 22b act as inductor elements. In this case, one end of each of the via holes 22a and 22b are connected to the first and second common electrodes 18a1 and 18b1, respectively. The other end of each of the via holes 22a and 22b are connected to the third ground electrode 20c. It is noted that the first and second via holes 22a and 22b are electromagnetically coupled to each other.

It is also noted that although not shown, a part of each of the capacitor electrodes 16a and 16b, the common electrodes 18a1, 18b1, 18a2, 18b2, 18a3 and 18b3 and the ground electrodes 20a, 20b and 20c is extended to the end of the dielectric layers 14 and each end face is exposed out of the side face of the laminate 12.

A number of external electrodes are formed on the side face of the laminate 12. Two external electrodes among the number of external electrodes are connected respectively with the first and second capacitor electrodes 16a and 16b and are used as input/output terminals T1 and T2. Other external electrodes interconnect the first, third and fifth common electrodes 18a1, 18a2 and 18a3 as well as with the second, fourth and sixth common electrodes 18b1, 18b2 and 18b3 to be used as connecting terminals. Further, other external electrodes are connected with the first, second, and third ground electrodes 20a, 20b and 20c to be used as ground terminals G.

A first capacitor C1 of one LC resonator R1 is formed among the third and fifth common electrodes 18a2, 18a3, and the first and third ground electrodes 20a, 20c and a first inductor L1 of the first LC resonator R1 is formed by the first via hole 22a. Further, a second capacitor C2 of a second LC resonator R2 is formed among the fourth and sixth common electrodes 18b2, 18b3 and the second and third ground electrodes 20b, 20c and a second inductor L2 of the second LC resonator R2 is formed by the second via hole 22b. It is noted that the first and second via holes 22a and 22b are electromagnetically coupled to each other. Further, a third capacitor C3 is formed among the first capacitor electrode 16a, the first and third common electrodes 18a1 and 18a2, and a fourth capacitor C4 is formed among the second capacitor electrode 16b and the second and fourth common electrodes 18b1 and 18b2.

Accordingly, the LC filter 10 shown in FIG. 5 also has the equivalent circuit shown in FIG. 7.

A sectional area of the inductor increases as compared to that of the prior art example shown in FIG. 8 also in the embodiment shown in FIG. 5 similar to the embodiments shown in FIGS. 1 through 4, so that the Q becomes large and the whole size can be kept small.

Figure 6:
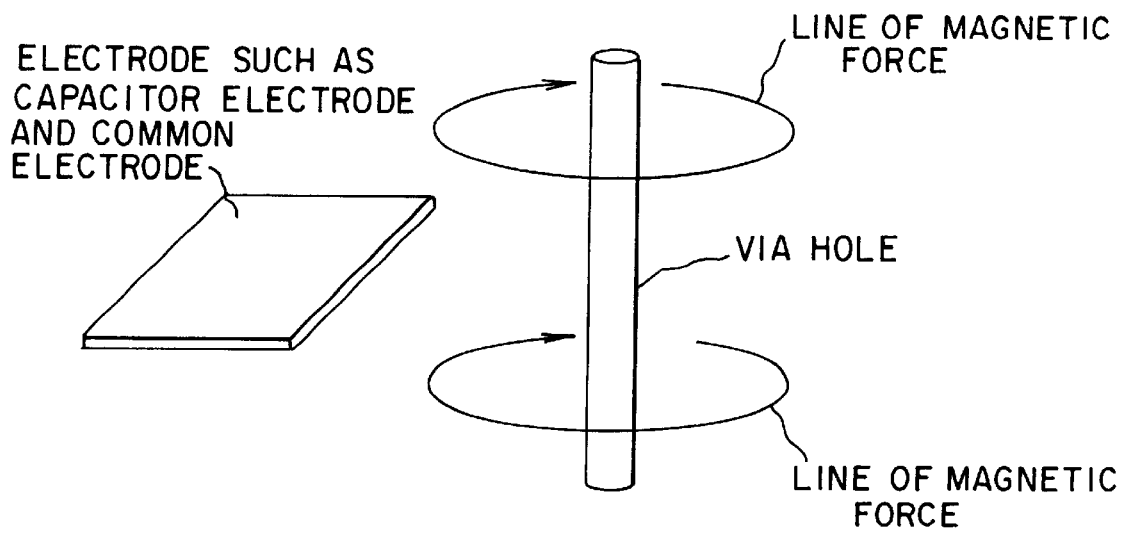
FIG. 6 is a diagrammatic view showing a relationship between lines magnetic force and an electrode such as a capacitor electrode or a common electrode.

Further, because the main surface of the electrode such as the capacitor electrode and the common electrode becomes parallel with lines of magnetic force generated by the via hole in the embodiment shown in FIG. 5 as shown in FIG. 6, less eddy current loss is caused by the lines of magnetic force on the capacitor electrode and common electrode and the Q will hardly drop.

It is noted that although the dielectric layers have been formed from ceramic layers in each embodiment described above, insulator layers or magnetic layers may be used in place of the ceramic layers in the present invention.

Further, although the dielectric layers in the form of ceramic layers have been formed by one thickness of ceramic green sheet in each embodiment described above, the number and the thickness of the ceramic green sheets forming the dielectric layers may be varied as design considerations make appropriate.

Although the via holes have been formed into the columnar shape in each embodiment described above, the via holes may be formed into another shape such as a square column in the present invention.

Although one inductor element is formed by one via hole or across two via holes in each embodiment described above, one inductor element may be formed across three or more via holes in the present invention.

Although a conductor paste is thick-film printed on the ceramic green sheet to form the capacitor electrodes and the common electrodes in each embodiment described above, the capacitor electrodes and common electrodes may be formed by other known means.

It is also noted that the present invention may be applied to other electronic parts with built-in or integrally formed inductors such as an inductor containing only one inductor element and an LC resonator containing one inductor element and one capacitor, besides the LC filter containing two LC resonators in the exemplary embodiments and others.

Further, all the electrodes within the laminate including the pattern electrodes, capacitor electrodes, ground electrodes, connecting electrodes and common electrodes are made out of Ag and Cu for example in each embodiment described above. The electrodes may be formed also by baking a paste in which metal powder such as Ag and Cu and organic binder are blended.

Still more, the metal around the via hole and the metal of the capacitor electrodes and others may be the same material similar to the embodiments described above.

It is also noted that it is desirable to form the inductor of the inventive resonator only by use of the via hole.

While preferred embodiments have been described, variations thereto will occur to those skilled in the art and are within the scope of the present inventive concepts which are delineated by the following claims.

What is claimed is:

1. A method of making an electronic part, comprising the steps of:

forming a plurality of dielectric layers and laminating the plurality of dielectric layers together;

forming a via hole penetrating through layers among said plurality of dielectric layers in a thickness direction thereof;

forming an inductor exclusively within said layers among said plurality of dielectric layers, said inductor comprising said via hole; and forming a capacitor electrode between at least two of said plurality of dielectric layers;

wherein the magnetic lines of force formed by said inductor are formed substantially parallel to the capacitor electrode.

2. The method of claim 1, wherein lines of magnetic force of said inductor are formed parallel to said capacitor electrode.

3. A method of making an electronic part, comprising the steps of:

forming a plurality of dielectric layers and laminating the plurality of dielectric layers together;

forming a plurality of via holes penetrating through layers among said plurality of dielectric layers in a thickness direction thereof;

forming an inductor comprising said plurality of via holes, wherein said inductor is exclusively formed within said layers among said plurality of dielectric layers; and forming a capacitor electrode between at least two of said plurality of dielectric layers;

wherein lines of magnetic force of said inductor are formed parallel to said capacitor electrode.

4. A method for producing an electronic part, comprising the steps of:
- forming a plurality of dielectric layers and laminating the layers together;
- forming an inductor comprising a via hole penetrating no more than partially through said plurality of laminated dielectric layers in the thickness direction thereof; and
- forming a ground electrode between two of said plurality of dielectric layers, said ground electrode being disposed perpendicular to and in electrical communication with said via hole;
- wherein said inductor is formed without the use of pattern electrodes; and
- wherein said inductor is exclusively formed within said plurality of laminated dielectric layers.

5. A resonator comprising:
- an inductor exclusively formed within a plurality of laminated dielectric layers; and
- a capacitor electrically connected in parallel with said inductor;
- wherein said inductor is formed by a via hole penetrating through at least one dielectric layer of said plurality of laminated dielectric layers and said capacitor is formed by a capacitor electrode disposed vertically to said via hole; and
- wherein lines of magnetic force of said inductor are parallel to said capacitor electrode.

6. A band-pass filter comprising a plurality of resonators, each resonator comprising:
- an inductor comprising a via hole through a plurality of laminated dielectric layers, said inductor being exclusively formed within said laminated dielectric layers; and
- a capacitor comprising a capacitor electrode connected to said inductor and disposed vertically to said inductor, said capacitor being electrically connected in parallel to said inductor;
- wherein said plurality of resonators are electromagnetically coupled to each other; and
- wherein lines of magnetic force of said inductor are parallel to said capacitor electrode.

7. An electronic part, comprising:
- a plurality of laminated dielectric layers;
- a plurality of inner electrodes, each of said inner electrodes being separated from an adjacent inner electrode by at least one of said plurality of dielectric layers in the thickness direction thereof, wherein said inner electrodes and said dielectric layers form capacitors; and
- an inductor formed by at least one via hole penetrating through said plurality of laminated dielectric layers in the thickness direction thereof, wherein said inductor is formed without the use of pattern electrodes and is exclusively formed within said laminated dielectric layers.

8. The electronic part of claim 7, further comprising a plurality of external electrodes respectively connected to said plurality of inner electrodes, at least two of said external electrodes interconnecting at least two of said inner electrodes, and at least one of said external electrodes forming an input terminal of said electronic part.

9. The electronic part according to claim 7, wherein lines of magnetic force of said inductor are parallel to said capacitor electrode.

10. The electronic part of claim 7, wherein the magnetic lines of force formed by said inductor are substantially parallel to the surfaces of said dielectric layers.

11. A resonator comprising:
- at least two inductors, wherein said at least two inductors are formed by via holes filled with conductive material penetrating through a plurality of dielectric layers, and said at least two inductors are electromagnetically coupled to each other; and
- a capacitor, wherein said capacitor is formed by a capacitor electrode disposed vertically to said via holes
- wherein lines of magnetic force of each of said at least two inductors are formed parallel to said capacitor.

12. A method of making an electronic part, comprising the steps of:
- forming a plurality of dielectric layers and laminating the layers together;
- forming at least two inductors by via holes filled with conductive material penetrating through said plurality of dielectric layers in the thickness direction thereof; and
- forming a capacitor electrode between said plurality of dielectric layers.

13. The method of claim 12, wherein lines of magnetic force of said at least two inductors are formed parallel to said capacitor electrode.

14. The method of claim 12, wherein said at least two inductors are formed without the use of pattern electrodes.

* * * * *